United States Patent [19]

Blandin

[11] 4,251,474
[45] Feb. 17, 1981

[54] ANNULAR GASKET FOR MOULDING LENSES FOR ORGANIC MATERIAL

[75] Inventor: Denis Blandin, Villiers-sur-Marne, France

[73] Assignee: Essilor International, Cie Generald d'Optique, Creteil, France

[21] Appl. No.: 123,456

[22] Filed: Feb. 21, 1980

[30] Foreign Application Priority Data

Feb. 23, 1979 [FR] France .................. 79 04717

[51] Int. Cl.³ ............................................ B29D 11/00
[52] U.S. Cl. .................. 264/1.1; 425/808; 249/187
[58] Field of Search ............... 425/808; 249/117, 187; 264/1

[56] References Cited

U.S. PATENT DOCUMENTS

| 3,136,000 | 9/1964 | Slyk | 425/808 |
| 3,555,610 | 1/1971 | Reiterman | 425/808 |
| 3,761,208 | 9/1973 | Boudet et al. | 425/808 |
| 4,166,088 | 8/1979 | Neefe | 425/808 |

Primary Examiner—J. Howard Flint, Jr.
Attorney, Agent, or Firm—Charles E. Brown

[57] ABSTRACT

An annular gasket for use in the moulding of ophthalmic or optical lenses of organic material, comprises two axially spaced ridges on its inner periphery arranged to cooperate tightly with two mould shells.

At least one of the annular ridges is formed at the end of an elastically deformable annular flange extending around the inner periphery at an angle to the axis of the gasket. The flange projects both from a corresponding transverse face of the gasket and from its internal peripheral face.

5 Claims, 11 Drawing Figures

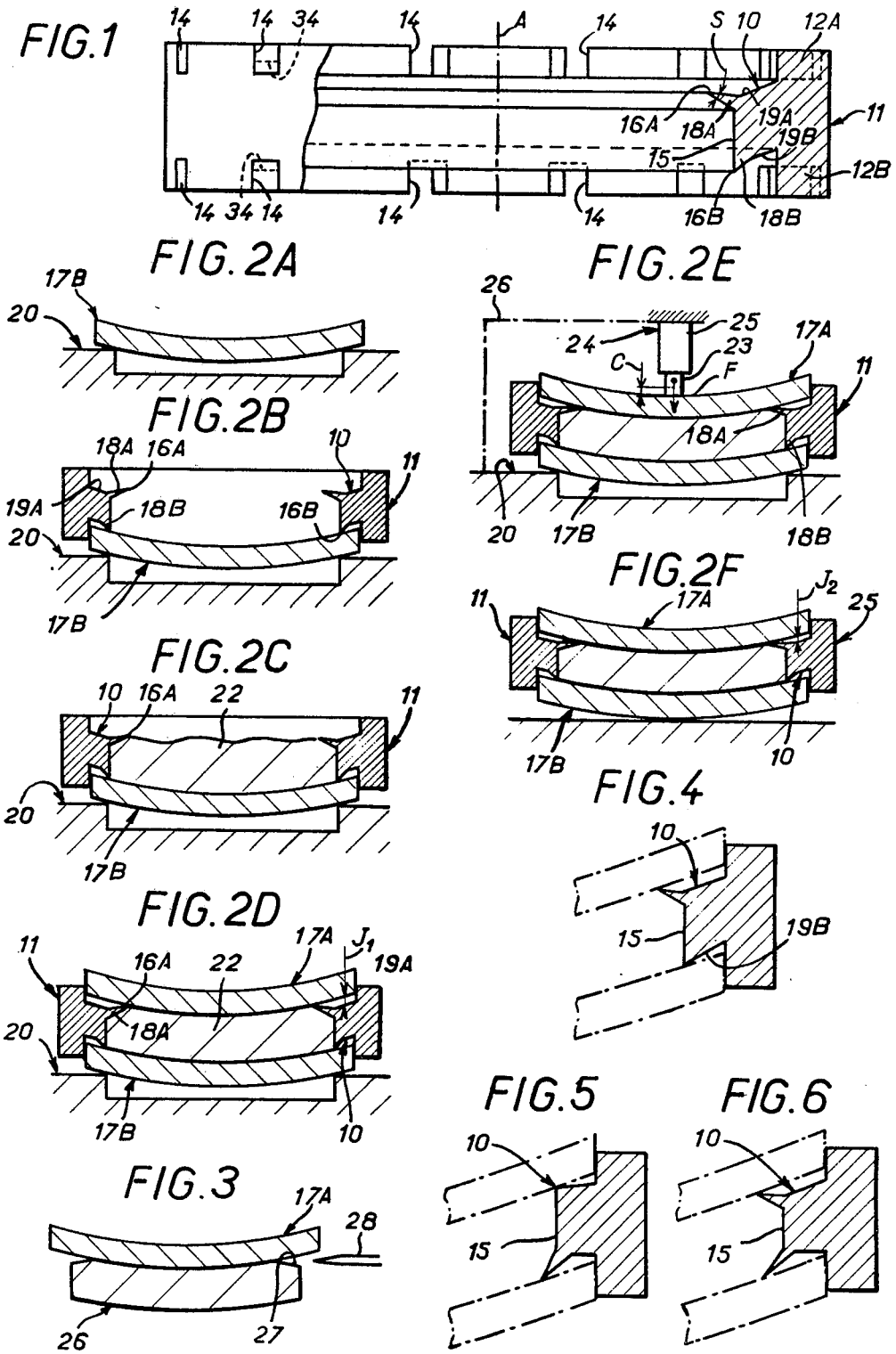

ANNULAR GASKET FOR MOULDING LENSES FOR ORGANIC MATERIAL

BACKGROUND OF THE INVENTION

The present invention relates to an annular gasket for use in the moulding of ophthalmic or optical lenses of organic material.

As is known, such lenses are normally moulded between two mould shells which are spaced from one another by an annular gasket which forms a distance-piece and ensures the tightness of the mould cavity defined between the mould shells.

Currently, in order to keep the mould shells in contact with the annular gasket separating them an elastic clamp is used which bears conjointly upon both of these mould shells from both sides of the annular gasket.

As is also known, the most commonly used organic materials for moulding ophthalmic or optical lenses require heating on order to set, this setting corresponding to a polymerisation, and in the course of this setting a not inconsiderable shrinkage occurs in the material.

Naturally, the mould shells must be able to follow such a shrinkage.

Initially, the mould shells follow this shrinkage because of their own elasticity under the joint action of the moulded material and the elastic clamp. However, the gasket interposed between the mould shells opposes any movement by the shells which would permit them to follow a more accentuated shrinkage of the material. Accordingly, this gasket must subsequently be removed and be replaced by a viscous product, in order to ensure that the polymerisation in progress will proceed under exclusion of air.

With such a process, therefore, not only must an annular gasket and an elastic clamp be used initially but also both the gasket and the clamp must subsequently be removed.

Such a process is complicated and, therefore, expensive. In addition, it involves the division of the heat treatment required for the polymerisation into two phases, namely a prepolymerisation phase at moderate temperature, with the gasket and clamp, and then, after removal of these items, a definite polymerisation phase at increased temperature. The inevitable result is that certain lenses produced in this manner have faults leading to their rejection.

However, in U.S. Pat. No. 3.555.610 it has been proposed to use an annular gasket which allows this process to be simplified and avoids any division of the heat treatment. This gasket has at its internal periphery an annular ridge which is formed at the end of an axially elastically deformable annular flange which enables it to cooperate tightly with one of the mould shells.

The capacity for axial elastic deformation of the annular flange makes it possible for the mould shells to approach one another after the material to be moulded has been put into place. Upon the release of the mould shells the annular flange of the gasket tends to return them to their initial configuration and thus a suction effect is created between the shells. This suction effect is sufficient to ensure, with complete reliability, that each of these mould shells is suitably kept in contact with the gasket. It is not then necessary to employ any type of elastic clamp to keep the shells in contact with the gasket. Furthermore, the gasket can be left in place during the final polymerisation stage of the moulded material, the elasticity of the annular flange permitting the gasket to follow the relative movement which is necessary so that the mould shells can follow the shrinkage of this material completely during the course of its polymerisation.

However, in the above mentioned U.S. Patent, the proposed annular flange only extends axially and only projects from the corresponding transverse face of the gasket. As a result, its elastic deformation capacity is essentially due to its capability of being crushed.

Such capabilities for crushing are in reality hard to control and, as previously, result in manufacturing problems.

Besides, in the above mentioned U.S. Patent, no particular arrangement has been proposed for controlling the movement of closure exercised between the mould shells while they are being placed in position.

This can result in considerable differences in the thickness of the lenses obtained, from one production to the next.

Although such differences in thickness do not constitute a major detect in half-finished lenses which undergo a final machining process providing them with their definite configuration, this is not the same for finished correction lenses, or afocal lenses, and more particularly for sunglasses, since basically no machining process is applied to these after they have been moulded.

In general terms, it is an object of the present invention to reduce these disadvantages.

SUMMARY OF THE INVENTION

According to the present invention there is provided an annular gasket for the moulding of ophthalmic or optical lenses, comprising two axially spaced annular ridges on its inner periphery for cooperating tightly with two mould shells, at least one of said annular ridges being formed at the end of an elastically deformable flange projecting from the gasket, wherein said annular flange extends at an angle to the axis of the gasket and said flange projects both from the corresponding transverse face of the gasket and from the internal peripheral face of the gasket.

As the annular flange is at an angle with respect to the axis of the gasket, the flange acts as a flexible member and not as a crushable one.

It is therefore, not necessary that the gasket has in itself a relative flexibility.

On the contrary, the gasket is advantageously of a relatively hard material so that it does not have to be stiffened, without having to fear that it will be deformed inopportunely during the moulding process in which it participates.

The present invention also extends to a process which permits the most advantage to be gained from the flexible working of the gasket.

According to the invention, in this process a suitable quantity of organic material is placed in position between two mould shells separated from one another by said annular gasket, either after only one of the mould shells has been placed in position or after both of the shells have been placed in position, and then a pressure is exerted axially on one of the said mould shells whilst the other shell is being supported, wherein for developing the pressure a mobile pin is actuated, the excursion of the pin being controlled.

Such a process results in great constancy, with good reproducibility being observed in the thickness of the ophthalmic or optical lenses obtained.

BRIEF DESCRIPTION OF THE DRAWINGS

Embodiments of the present invention will hereinafter be described, by way of example, with reference to the accompanying drawing, in which:

FIG. 1 shows an elevation, partly in section, of an annular gasket of the invention;

FIGS. 2A, 2B, 2C, 2D, 2E and 2F show axial sections illustrating successive steps in a process of applying the annular gasket of FIG. 1;

FIG. 3 shows an axial section analogous to those of FIGS. 2 after removal of the annular gasket; and FIGS. 4 to 6 show part axial sections of embodiments of an annular gasket of the invention.

DESCRIPTION OF THE PREFERRED EMBODIMENTS

The annular gasket 10 illustrated in FIG. 1 comprises a body having a peripheral skirt 11 which appears to be completely cylindrical but which for ease of manufacture is substantially conical or biconical. The gasket forms an annular band which projects against the internal face of the peripheral skirt all around the central part of this skirt.

Thus, in the embodiment illustrated, the peripheral skirt 11 extends axially on both sides of the annular gasket 10, that is to say both towards the top, at 12A, and towards the bottom, at 12B.

In the embodiment illustrated, and for reasons which will eventually become apparent, the upper parts 12A and the lower parts 12B of the skirt contain slots 14 in various locations.

In the embodiment illustrated, the body of the annular gasket 10 extends at an angle with respect to its axis A, which also forms the axis of the peripheral skirt 11, such that, as shown by the dot-dashed line in FIG. 1, the gasket 10 approaches the axis A in the downward direction. In this manner, the gasket forms an obtuse angle with the upper part 12A of the skirt 11 and an acute angle with the lower part 12B of the skirt.

At its internal periphery, which is defined by a conical cylindrical or conical and cylindrical surface 15, the annular gasket 10 comprises two annular ridges 16A, 16B axially spaced from one another. As will become apparent later, the annular ridges 16A, 16B enable the gasket to cooperate tightly with two mould shells 17A, 17B.

At least one of these annular ridges 16A, 16B, the ridge 16A in the embodiment shown in FIGS. 1 to 4, is formed at the end of an elastically deformable flange 18A which projects from the annular gasket 10 by having been moulded in one piece with the latter. The whole flange 18A extends at an angle with respect to the axis A of the gasket. The annular flange 18A projects both from the corresponding transverse oblique face 19A of the said gasket and from the internal peripheral face 15 of the latter.

In axial section, the annular flange 18A has a triangular profile with an acute angle at its apex S.

The angle at the apex S is preferably less than 40° but this value must not be considered as constituting a limitation to the invention.

Indeed, in order to apply the invention, and as will be shown hereafter, it is sufficient that the annular flange 18A is able to flex elastically when it is subject to a force exerted parallel to the axis A of the gasket.

In the embodiment shown in FIG. 1, the ridge 16B is also formed at the end of an annular, elastically deformable flange 18B, but the flange 18B extends substantially parallel to the axis A of the gasket 10 and only projects from the corresponding transverse face 19B of the gasket and not from its internal peripheral face 15.

The capacity for deformation of this annular flange 18B can only be exerted axially and is, therefore, considerably less than that of the annular flange 18A.

An optical or ophthalmic lens of organic material can be manufactured with the aid of the gasket described above by the following process.

Firstly, as shown in FIG. 2A, the mould shell 17B is placed on a fixed support plate 20. In practice the mould shell which has a concave moulding surface, is made, for example, from glass, and particularly from toughened glass. Preferably, the mould shell has a substantially uniform thickness, as is normal in this field.

Then, as can be seen from FIG. 2B, the annular gasket 10 of the invention is placed on the supported mould shell 17B. The lower part 12B of the skirt 11, which is of one piece with the gasket 10, ensures that the gasket 10 is appropriately centred with respect to the mould shell 17B. In addition, the annular ridge 16B of the gasket 10 bears upon the concave moulding surface of the mould shell 17B.

Then, a suitable quantity of organic material to be moulded is placed on the mould shell 17B as illustrated in FIG. 2C. For example, the organic material may be a monomer known under its trade name "CR 39", that is polyethylene glycol diallyl dicarbonate with the addition of a catalyst, for example isopropyl percarbonate.

As shown in FIG. 2D, the mould shell 17A, which has a convex moulding surface and which is of an analogous composition to that of the mould shell 17B, is then placed on the annular gasket 10.

If preferred, the quantity of organic material to be moulded can be placed in the mould only after the mould shell 17A has been engaged with the annular gasket 10. In this case, the organic material can be inserted by means of an injection nozzle (not shown) suitably positioned between the mould shell 17A and the gasket 10.

Whatever the case may be, the upper portion 12A of the peripheral skirt 11 ensures that the mould shell 17A is appropriately centred with respect to the annular gasket 10, and the annular ridge 16A if the gasket bears upon the moulding surface of the mould shell 17A.

As shown in FIG. 2D, when the mould has been assembled an axial clearance J1 exists between the mould shell 17A and the corresponding transverse face 19A of the annular gasket 10.

As the mould shell 17B rests on and is supported by the support plate 20, an axial pressure is then exerted on the mould shell 17A in the direction of arrow F in FIG. 2E, in order to obtain the desired suction effect.

For the purpose of developing this axial pressure a mobile pin 23 is used, the excursion C of which between its initial position, indicated by a dashed line in FIG. 2E, at which it contacts the mould shell 17A, and its final position, by which it also defines the final position of the mould shell 17A, is accurately controlled.

Preferably, but not necessarily, this pin 23 acts with a constant pressure.

For example, the pin 23 can quite simply be the piston of a pneumatic or hydraulic jack 24 the body 25 of which is fixed, as shown in dot-dashed lines in FIG. 2E, to a bracket 26 which is mounted to rotate around a vertical axis with respect to the support plate 20.

However it is achieved, the displacement of the mould shell 17A towards the mould shell 17B, which is fixed, has a double effect: on the hand, it forces surplus moulding material to flow back towards the exterior and this return flow is facilitated by the slots 14 in the upper parts 12A and lower parts 12B of the peripheral skirt 11; and on the other hand, it causes an elastic deformation of the annular flange 18A, by bending, and to a lesser extent, of the annular flange 18B, by crushing.

It is this elastic deformation of the flanges which causes the suction effect required. Indeed, when the mould shell 17A is released, as shown in FIG. 2F, the annular flanges 18A, 18B tend to resume elastically their initial configuration. Because of the resulting return movement of the mould shell 17A, a reduced pressure, which is characteristic of such a suction effect, is produced in the mould cavity defined by the mould shells 17A, 17B and the gasket 10. This reduced pressure is sufficient to ensure that the mould shells 17A, 17B are suitably held against the annular gasket 10.

For this reason, no clamp is required for this holding action, and the assembly consisting of the mould shells 17A, 17B, the annular gasket 10 and the moulded material confined therebetween can be placed without any other components into an air or water stove where the moulded material is subjected to uninterrupted heat treatment for the purpose of polymerisation.

In practice, the axial pressure initially applied to the mould shell 17A is applied in such a manner that after the release of the pressure an axial clearance J2 exists between the mould shell 17A and the corresponding transverse wall 19A of the gasket 10. The gap J2 is sufficient to allow the mould shell 17A to follow the shrinkage of the moulded material without coming to rest against the transverse face 19A of the annular gasket 10.

After polymerisation of the moulded material, the annular gasket 10 is removed. In general, the mould shell 17B is then removed since the lens 26 obtained normally adheres more strongly to the mould shell 17A, as illustrated in FIG. 3. However, in the case where the mould shell 17B, which is the one with the concave moulding surface, is an "expensive" mould shell, the mould shell 17A is removed first as the disengagement of the shell 17A releases the stresses in the assembly due to the shrinkage of the moulded material during its polymerisation. In this way it is posible to avoid any damage to the mould shell 17B.

However the lens is released, the annular flange 18A forms a recess 27 between the lens 26 and the shell 17A which allows a tool 28, for example a spatula, to be inserted to facilitate separation of the moulded lens 26 from this mould shell 17A.

In the embodiment shown in FIG. 4, the annular ridge 16B of the gasket 10 is directly defined by the latter, without being particularised by a flange. The ridge 16B is thus the direct result of the intersection of the internal peripheral face 15 of the annular gasket 10 with the corresponding transverse face 19B of the gasket 10.

In the embodiment shown in FIG. 5, an inverse arrangement to that of FIG. 4 is adopted. Here the ridge 16B is formed at the end of an elastically deformable annular flange extending at an angle with respect to the axis of the gasket, the ridge 16A being directly defined by the gasket 10 without particularisation by any flange.

In the further embodiment shown in FIG. 6, both the ridges 16A, 16B are formed at the end of an elastically deformable flange extending at an angle with respect to the axis of the gasket.

The present invention is not limited to the embodiments which have been described and illustrated, but encompasses variants thereof and/or combinations of the various features described.

Nevertheless, it must be noted that in the case of a mould shell with a spherical moulding surface, either concave or convex, the arrangement of a flange is preferably adopted for this moulding shell with a spherical moulding surface, since the tightness conditions to be considered are then more favourable for such a spherical moulding surface.

The upper part 12A of the peripheral skirt 11 can be continued around the circle, in which case its slots 14 are replaced by passages with a closed transverse section, as shown by dashed lines at 34 in FIG. 1. Passages 34 can similarly be provided in the lower part 12B of the said peripheral skirt 11.

Indeed, as the only purpose of the peripheral skirt 11 is to ensure that the mould shells are appropriately centred, the skirt is not essential and can therefore be eliminated, particularly if other means are employed for ensuring the centering.

The annular gasket may be formed in a single piece by being moulded of a synthetic material of a thermoplastic elastomer type.

Such a material is preferably selected to present considerable hardness, for example a Shore A hardness factor of 90 or similar, and to preserve its initial properties within the temperature range of the polymerisation heat treatment to be applied.

I claim:

1. An annular gasket for the moulding of ophthalmic or optical lenses, comprising two spaced transverse faces and an inner peripheral face, two axially spaced annular ridges on its inner peripheral face for cooperating tightly with two mould shells, at least one elastically deformable flange projecting from said inner peripheral face, one of said annular ridges being formed at the end of said annular flange, wherein said annular flange extends at an angle to the axis of the gasket, and said flange projects both from the inner peripheral face of the gasket and from a respective one of the transverse faces of the gasket.

2. An annular gasket according to claim 1, wherein, in axial section, the annular flange has a triangular profile with an acute angle at its apex.

3. An annular gasket according to claim 2, wherein the acute angle at the apex of the flange is less than 40°.

4. An annular gasket according to claim 1, further comprising a second elastically deformable annular flange projecting from said inner peripheral face, the other of said annular ridges being formed at the end of said second annular flange.

5. A process for employing a gasket according to claim 1, comprising placing a suitable quantity of organic material between two mould shells separated from one another by said annular gasket, the organic material being positioned either after only one of the mould shells has been placed in position or after both of the shells have been placed in position, and then exerting a pressure axially on one of the said mould shells while the other shell is being supported, wherein for developing the said pressure a mobile pin is actuated, the excursion of said pin being kept under control.

* * * * *